United States Patent [19]

Inoue et al.

[11] Patent Number: 5,446,392
[45] Date of Patent: Aug. 29, 1995

[54] SUBMARINE EQUIPMENT AND FAULT LOCATING METHOD FOR A SUBMARINE COMMUNICATION SYSTEM

[75] Inventors: Yoshiyuki Inoue; Makoto Sumitani, both of Kawasaki, Japan

[73] Assignee: Fujitsu Limited, Kawasaki, Japan

[21] Appl. No.: 128,671

[22] Filed: Sep. 30, 1993

[30] Foreign Application Priority Data

Feb. 10, 1993 [JP] Japan .................. 5-021542

[51] Int. Cl.⁶ .............................. G01R 31/02
[52] U.S. Cl. .................. 324/678; 324/519; 379/30; 361/111
[58] Field of Search ............ 324/519, 543, 541, 678; 379/1, 25, 30, 32; 361/111, 119, 56

[56] References Cited

U.S. PATENT DOCUMENTS

| | | | |
|---|---|---|---|
| 4,183,225 | 7/1979 | Stephens | 324/519 |
| 4,438,477 | 3/1984 | Cauley | 361/119 |
| 4,459,631 | 7/1984 | McNamee | 361/111 |
| 4,748,652 | 5/1988 | Nagai | 379/26 |
| 4,820,991 | 4/1989 | Clark | 324/519 |
| 5,073,920 | 12/1991 | Masukawa | 379/30 |
| 5,136,453 | 8/1992 | Billingsley | 361/111 |
| 5,162,963 | 11/1992 | Washburn et al. | 361/111 |
| 5,198,957 | 3/1993 | Welty | 361/111 |

FOREIGN PATENT DOCUMENTS

| | | | |
|---|---|---|---|
| 2931466 | 10/1980 | Germany | 324/519 |
| 0028677 | 2/1987 | Japan | 324/519 |
| 0029270 | 2/1988 | Japan | 324/519 |
| 0264351 | 10/1989 | Japan | 379/30 |
| 2202110 | 9/1988 | United Kingdom . | |
| 2248373 | 4/1992 | United Kingdom . | |
| 2252686 | 8/1992 | United Kingdom . | |
| 0750388 | 7/1980 | U.S.S.R. | 324/519 |

OTHER PUBLICATIONS

Oct. 1972 KDD Tech J. (Japan) No. 74 Yamamura et al. An Open Fault localization Test set for Ocean Cable.

*Primary Examiner*—Maura K. Regan
*Attorney, Agent, or Firm*—Staas & Halsey

[57] ABSTRACT

A fault locating method and submarine equipment for detecting the location of a fault developed in a communication system including an optical submarine cable and submarine equipment such as repeaters and branching units inserted in the cable, which is supplied with operating current via a feed line of the cable. The submarine equipment has a main processing circuit for transmitting signals via the submarine cable; an power unit inserted in the feed line so as to supply operating power for the main processing circuit by receiving the operating current from the feed line; a nonlinear resistance device which is connected to the feed line and the resistance value of which increases as a current flowing through it decreases, and a charging/discharging resistor disposed in parallel to the nonlinear resistance device. The fault locating method detects the location of an open-circuit fault occurring in the cable by measuring the capacitance of the open-circuit cable. The capacitance measurement is quickly and accurately carried out by charging and discharging the cable capacitance through the charging/discharging resistor.

7 Claims, 7 Drawing Sheets

SUBMARINE EQUIPMENT AND FAULT LOCATING METHOD FOR A SUBMARINE COMMUNICATION SYSTEM

BACKGROUND OF THE INVENTION

1. Field of the Invention

The present invention relates to, for example, a fault locating method for a submarine optical communication system, having a plurality of submarine equipments, such as repeaters or branching units, connected in series on the cable, and being supplied an operating power through the feed line provided in the cable, and relates to submarine equipments adaptable for the fault locating method.

2. Description of the Related Art

In a submarine cable communication system for effecting communication among multi-points by using submarine cables such as submarine optical fiber cable, a plurality of submarine equipments is connected sequentially in the submarine cable at predetermined intervals.

Submarine equipments, such as repeaters for repeating light wave signals or branching units for branching optical fibers, are installed in the sea water, and fed electrical power to operate main processing circuits thereof for transmitting light wave signals, through a feed line conductor contained in the submarine cable by constant-current power-supply units placed at cable landing stations.

There are two types of the constant-current serial feeding system, one type is a bidirectional type in which the direction of the feed current inverses if necessary, and is useful in the multi-point communication system in which the fault section of the cable should be disconnected from normally operating cable route. The other type is a unidirectional type in which the feed current flows only in one predetermined direction.

At least one power unit is provided in each submarine equipment to take out operating power from the feed line, and the power unit has a structure adaptable for the current feeding type.

Meanwhile, when the current supply to the submarine equipment is stopped due to an open-circuit or a short-circuit of the feed line, it is necessary to detect quickly, from the landing station, the location of cable fault occurred, in order to repair the broken cable for fast recovery of the communication system.

There have been conventionally used three types of fault locating methods in order to detect the location of the fault in the feed line; a resistance-measuring method for short-circuit fault, a pulse-echo method and capacitance-measuring method for open-circuit fault.

In the resistance-measuring method, the resistance of the feed line conductor of living section of the cable is measured from the landing station via the loop path consisting of the feed line and the sea-ground returning path, then the distance to the fault location is obtained by using the measured resistance value and previously known resistivity per unit length of the feed line conductor.

In the pulse-echo method, the location of the fault can be obtained by the measurement of the going-and-returning transmission time of low frequency pulse through the feed line between the measuring equipment at the landing station and the fault point.

In the capacitance measuring method, the electrostatic capacitance of an equivalent capacitor formed in the submarine cable is precisely measured, regarding the submarine cable between the landing-station and the open point as a co-axial condenser having a center conductor of the feed line surrounded dielectric materials and an outer conductor of the sea water ground.

In order to apply the capacitance measuring method for an open-circuit fault locating on the submarine cable communication system adopting above mentioned serial constant current feeding system, as the feed line of submarine cable is divided into many sections by power units of submarine equipments, the total capacitance of equivalent capacitors each of which is formed on the individual cable section, must be precisely measured.

The existence of power circuits connected in series in the feed line causes a deterioration of the accuracy of capacitance measurement of the submarine cable.

SUMMARY OF THE INVENTION

An object of the present invention is to improve the fault locating method so that the capacitance measurement is carried out at a high accuracy and by a shorter measuring time.

The other object of the present invention is to provide a submarine equipment for the submarine cable communication system to which fault locating method by cable capacitance measurement is effectively applied.

In order to achieve the aforesaid object, according to a first aspect of the present invention, there is provided a submarine equipment for a submarine cable communication system, inserted into a feed line of a submarine cable connecting a plurality of cable landing stations, the feed line supplied with operating currents from the cable landing stations, the submarine equipment comprising:

a main processing circuit for transmitting communication signals through the submarine cable;

a power unit, connected in series to the feed line, for taking out the operating current from the feed line for supplying power to said main processing circuit;

a nonlinear resistance device, connected in series to said power unit, the resistance of which increases according to decrease in the feed current; and a charging/discharging resistor connected in parallel to said nonlinear resistance device.

According to another aspect of the present invention, there is provided a fault locating method for a submarine cable communication system, having a plurality of cable landing stations connected to each other by submarine cables; the submarine cable having a plurality of submarine equipment connected in the cable and fed electric power from said landing station via a feed line of said submarine cable to transmit communication signals between landing stations, said method comprising the steps of:

charging an equivalent-capacitor formed by the feed line arranged from the landing station to the fault point and sea-water ground through a charging route consisting of charging/discharging resistors each connected in parallel to a nonlinear resistance device of the submarine equipment and the feed line so that the equivalent-capacitor is charged up to a predetermined voltage; and discharging the charge being charged in the equivalent-capacitor to the landing station through a discharging route which is the same as the charging route so that the capacitance of the equivalent-capacitor can be measured.

The charging electric current and the discharging electric current for use at the time of measuring the capacitance of a submarine cable to locate an open-circuit fault are arranged to flow in submarine equipment in which the charging/discharging resistors are in parallel connected to a nonlinear resistance device such as a diode. Therefore, the series resistance of the charging/discharging route is not enlarged even if the potential difference between the terminals of each submarine equipment becomes small at the final stage of charging/discharging an equivalent capacitor formed by the cable. Therefore, the overall length of the cable can be charged to the same measuring potential in finite time period. Furthermore, the capacitance of the cable can be accurately and quickly measured as compared with the conventional technology because the charge of the cable is discharged in a finite time period at the time of measuring the charge.

BRIEF DESCRIPTION OF THE DRAWINGS

The above objects and features of the present invention will be more apparent from the following description of the preferred embodiments with reference to the accompaning drawings, wherein.

DESCRIPTIONS OF THE PREFERRED EMBODIMENT

Figure 1:
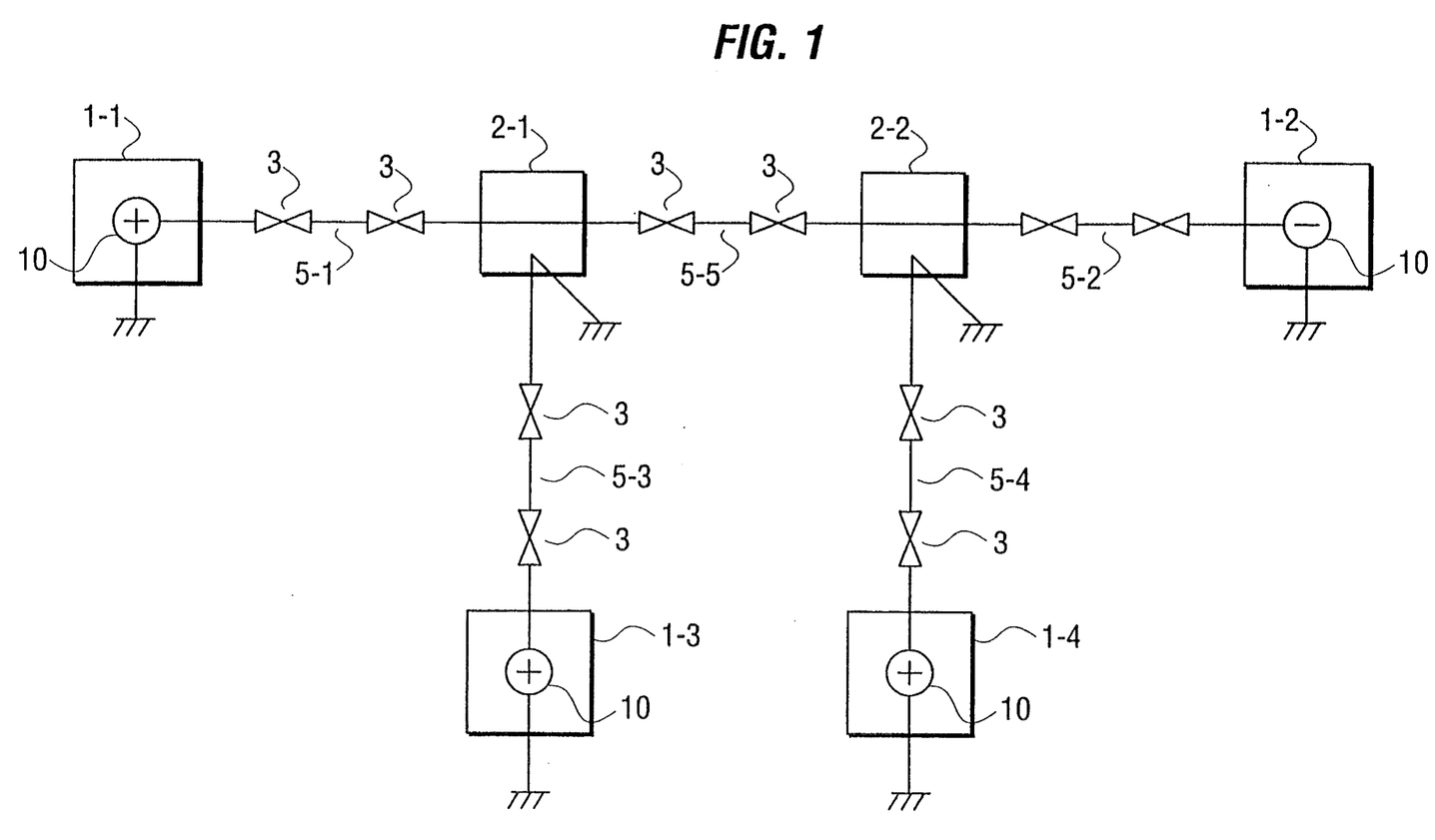
FIG. 1 is a block diagram of the submarine cable communication system to which the present invention is applied.

FIG. 1 shows a submarine optical cable communication system to which the present invention is effectively applied.

As shown in FIG. 1, in the submarine optical cable communication system, a plurality of cable landing stations 1-1 to 1-4 is connected each another by submarine optical cables 5-1 to 5-5 through submarine branching units 2-1, 2-2.

Each submarine optical cable contains a several number of optical fibers and one feed line conductor, and has a plurality of repeaters 3 inserted into the cable at predetermined intervals. Repeaters 3 inserted between two main landing stations 1-1, 1-2 are connected in series by the feed line of submarine cables 5-1, 5-5, 5-2 connecting both main lading stations, and are supplied with an operating current through the feed line by constant-current sources 10 installed at both landing stations 1-1, 1-2 . Repeaters 3 connected to submarine cables 5-3, 5-4 branching from branching units 2-1, 2-2 are fed the operating current through the feed line of submarine cables 5-3, 5-4 from the constant-current sources 10 of sub landing stations 1-3, 1-4. The feed current fed from sub landing stations 1-3, 1-4 flows into the sea ground at the branching unit 2-1, 2-2, and returns to the corresponding sub landing station through the ground path.

Figure 2:
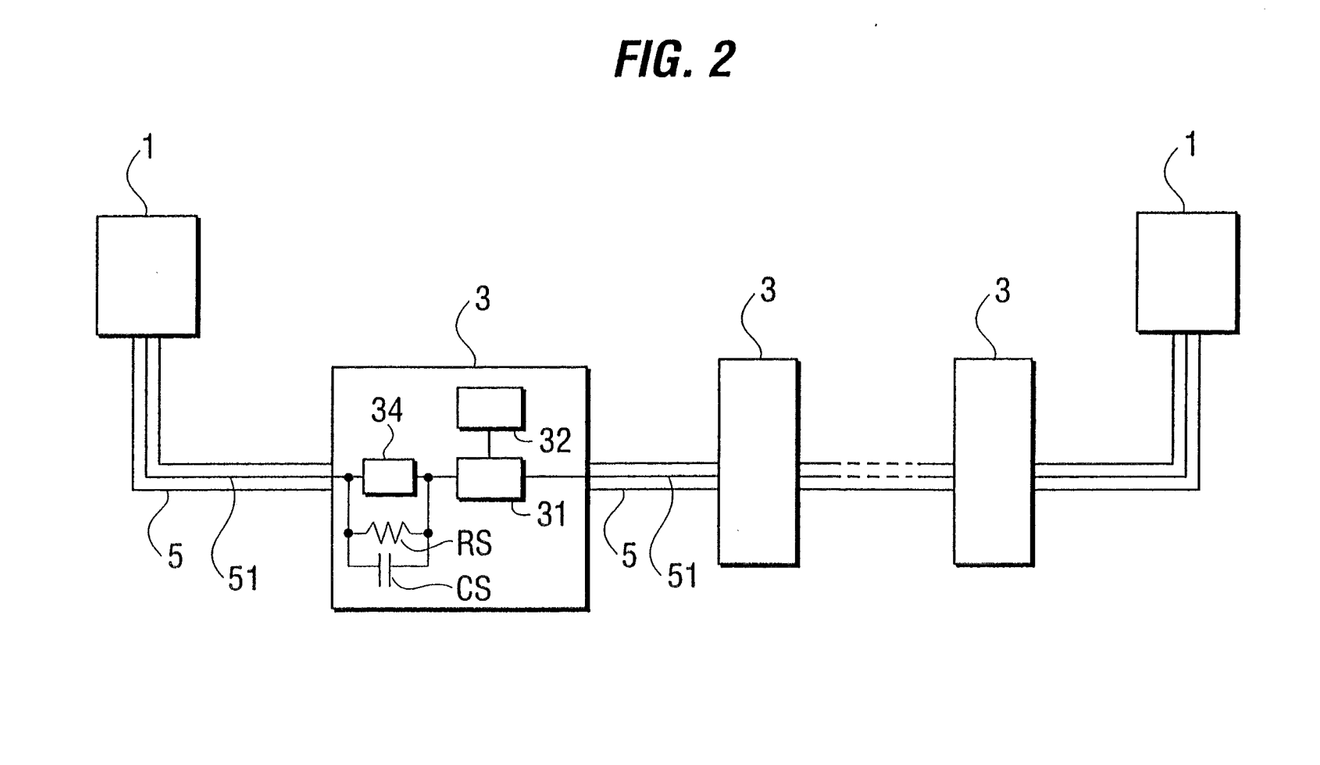
FIG. 2 is a principal block diagram of a submarine equipment embodying the present invention.

FIG. 2 shows principally a concept of submarine equipment utilized in a submarine optical cable communication system, according to the present invention.

A plurality of submarine equipment 3, such as a repeater or a branching unit, is connected in series on a feed line 51 of a submarine cable 5 which is connecting two landing stations 1, and is supplied with an operating current through the feed line 51 from cable landing stations. Each of the submarine equipment 3 has at least one main processing circuit 32 which, in the case of a repeater, regenerates optical signals transmitting through the optical fiber of the submarine cable 5, or, in the case of a branching equipment, makes optical signals to branch from a main-cable route to a branch-cable route. A power unit 31 is connected in series to the feed line 51 in the equipment 3, and supplies the main processing circuit with an operating current. A nonlinear resistance device 34 is also connected to the feed line 51 in series to the power unit 31. The nonlinear resistance device has a current depending resistance characteristics so as the resistance increases up to an almost infinite value according to the decrease in the current passing therethrough, and is representing a diode inserted on the feed line in the same direction to the current flow in order to rectify the bidirectionally fed feed current, or in order to prevent the power unit from an abnormal surging current applied in the direction opposite to that of the normal feed current.

Further,the submarine equipment 3 has a charging/discharging resistor RS connected in parallel at least with the nonlinear resistace device 34, preferably with the series circuit of the nonlinear resistance device 34 and the power unit 31.

When a fault locating method is applied in case of an open-circuit fault on the submarine cable, this charging/discharging resistor RS works as a bypassing route through which the charging/discharging current flows at the measuring process of the capacitance of capacitor form by the submarine cable, achieving the quicker and more accurate measurement of the cable capacitance.

Figure 3:
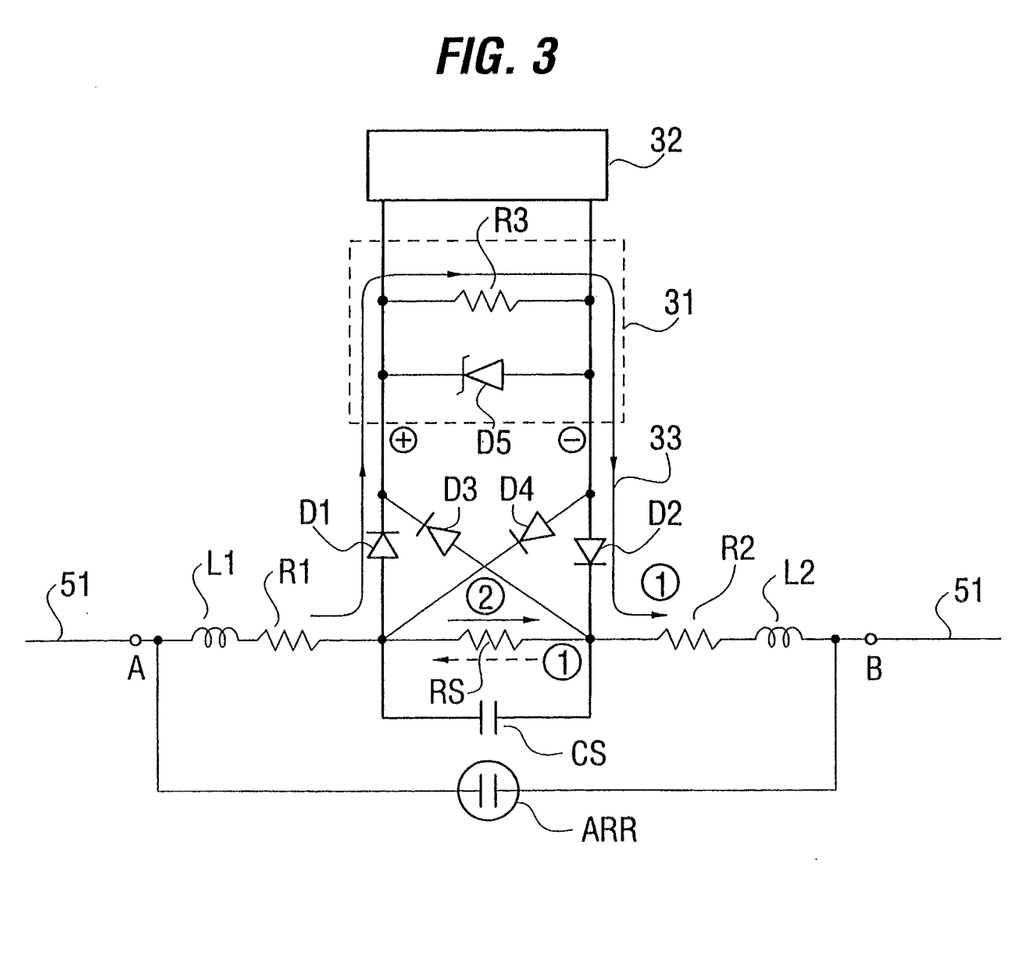
FIG. 3 is a diagram of a submarine equipment to which the operating current can be fed in bidirection, embodying the present invention.

FIG. 3 shows a block diagram of a submarine equipment for a bidirectional serial feeding system, as another embodiment according to the present invention.

As shown in the figure, this submarine equipment comprises at least one main processing circuit 32, a power unit 31, a diode bridge rectifier circuit 33 consisting from four rectifier diodes D1,D2,D3,D4, two choke coils L1, L2, two resistors R1, R2, an arrester ARR, a charging/discharging resistor RS of several tens k Ω, a shunt capacitor CS of several μF. The feed line 51 of the incoming cable and the outgoing cable is terminated to the submarine equipment at the point A and the point B, respectively. The power unit 31 consists of a Zener diode D5 and a resistor R3, and supplies the main processing circuit 32 with operating power of constant voltage equivalent to the Zener voltage of the Zener diode D5. By obtaining this power from the power unit 31, the main processing circuit 32 operates in the intended manner in order to achieve optical communication through the submarine cable. The resistor R3 is arranged to the resistance value of less than several hundreds Ohms in order to bypass extra current represented as the residual value of excepting operating currents for main processing circuit 32 and the Zener diode D5 from the total feed current.

In the submarine equipment, each of two feed lines is connected to the input point of the diode bridge rectifier circuit 33, via the series connection of the choke coil L1, L2 which has high impedance to a high speed surge current, and current-limiting resistance R1, R2. The rectifier diode D1 to D4 has ten and several volt of Zener voltage, which value is lower by several volts than the Zener voltage of the Zener diode D5. The arrester ARR is connected in parallel with the series circuit consisting of the diode bridge rectifier circuit 33, choke coil L1, L2, and resistor R1, R2, between the point A and B, and absorbs the surge energy applied from the feed line in spite of the direction of the surge current.

In the case where a submarine equipment has a plurality of main processing circuits, the corresponding number of power units with a diode bridge rectifier circuit is provided in one submarine equipment, and those diode bridge rectifier circuits are connected in series accompaning the series connection of the choke coil and current limiting resistor at both outer sides, and an arrester is connected parallel with the above mentioned whole connection.

In the submarine equipment, as described above, the diode bridge rectifier circuit 33 performs as a full-wave rectifier circuit, so that the power unit 31 can always get the power supply voltage having the same polarity, as shown in the figure, in spite of the direction in which the feed current is supplied.

Then there will be explained the resistivity of above mentioned equipment against surge currents applied in any direction through the feed line due to any cable fault. The rectifier diodes D1 to D4 become conductive for the surge energy of voltage higher than their Zener voltage, so the surge current can flow through the diode bridge rectifier circuit 33, as a result, the power unit and the main processing circuit can be effectively protected from high voltage surge current in any direction.

The role of the charging/discharging resistor RS and the shunt capacitor CS will be described later.

Figure 4:
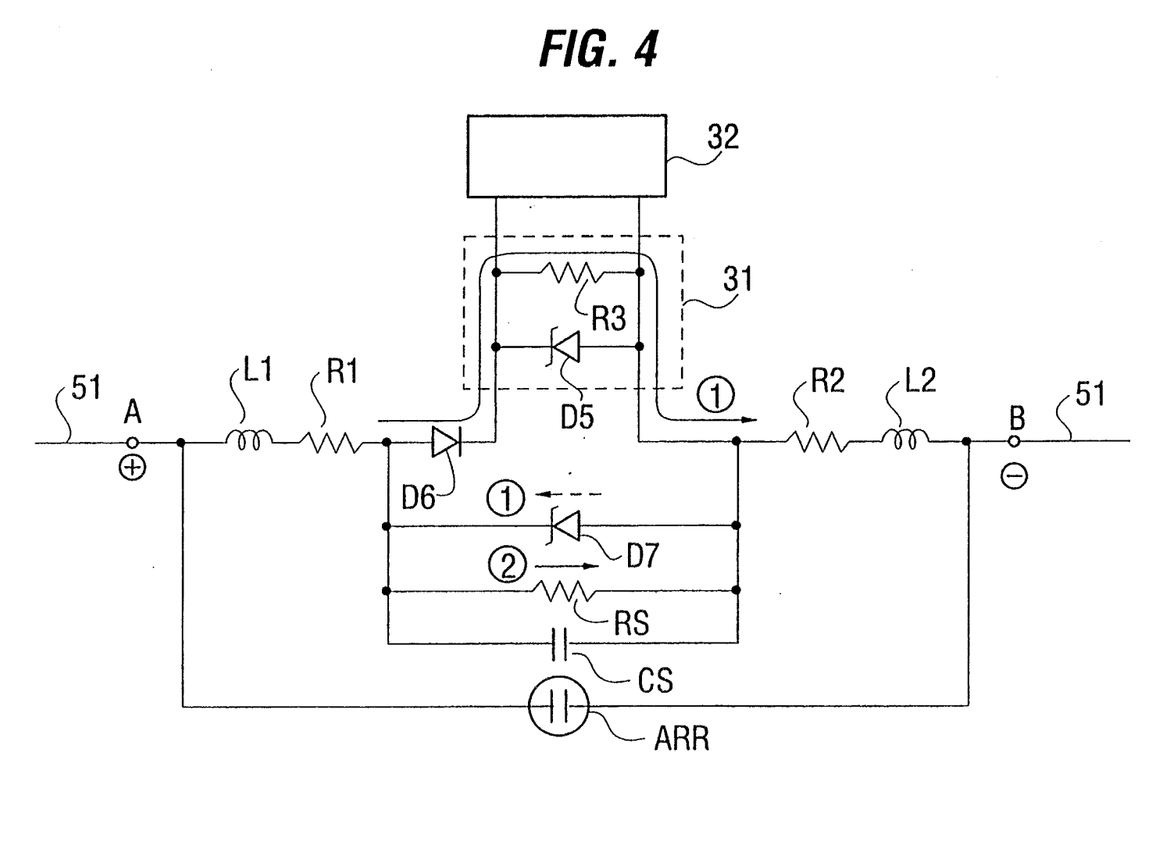
FIG. 4 is a diagram of a submarine equipment to which the operating current is fed in one direction, embodying the present invention.

FIG. 4 shows a block diagram of a submarine equipment for a unidirectional serial feeding system, as the third embodiment according to the present invention.

In FIG. 4, the same reference numerals and letters as in FIG. 3 designate the same unit as in FIG. 3.

This submarine equipment is for the unidirectional feeding system in which the feed current flows only in one direction (point A to point B in FIG. 4), and is able to absorb effectively any surge voltage applied in the opposite direction to the feed current.

The constitution of this submarine equipment only differs from that in FIG. 3 by that there are provided instead of the diode bridge rectifier circuit, a diode D6, inserted on the feed line in the forward direction to the feed current, and a Zener diode D7 are provided instead of the diode bridge rectifier circuit. The Zener voltage of the Zener diode D7 is set rather higher than that of the Zener diode D5 in the power unit 31. The feed current flows through the equipment by the path consisting of the choke coil L1, the resistor R1, the diode D6, the power unit 31, the resistor R2 and the choke coil L2, supplying the main circuit 32 a Zener voltage (12 volt) of the Zener diode D5 in the power unit 31, as an operating power.

In the case when a surge current in the same direction to the feed current is applied due to any cable fault, the surge current is stopped by the choke coil L1, L2, and is made to flow through the arrester ARR, so that the power unit 31 can avoid suffering from the abnormally high voltage. When a surge current having the direction opposite to the feed current is applied through the feed line, the diode D6 become high impedance because of its backward-biased state, and the Zener diode D7 becomes low impedance because of its forwards-biased state. Therefore, the surge energy is able to bypass effectively through the Zener diode D7, so that the main processing circuit 32 which is mostly made of MOS-ICs and is weak against the backward voltage, can be protected from the backward surge more effectively than from the forward surge. Also the role of the charging/discharging resistor RS and the shunt capacitor CS in FIG. 4 will be described later.

Meanwhile, when the current supply to the submarine equipments is stopped due to a break-down or a short-circuit of the feed line, it is necessary to search quickly the location of cable fault occurred, in order to repair the broken cable for fast recovery of the communication system.

Now, by using FIG. 5, there is described below how the fault locating method by capacitance measurement is carried out, when an open-circuit fault occurs due to a break-down of the submarine cable in the submarine cable communication system having above mentioned submarine equipment.

Figure 5:
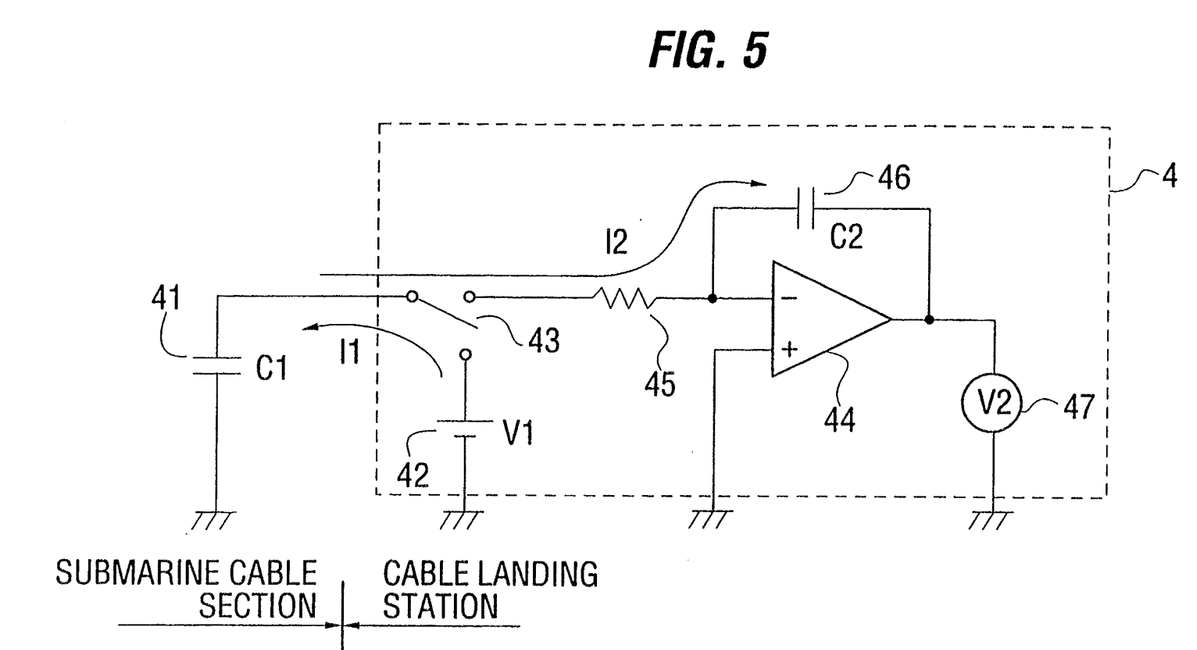
FIG. 5 is a diagram of a bidirectionally fed submarine equipment without a charging/discharging resistor, explaining the charging/discharging route in a fault locating process.

In FIG. 5, 4 is a capacitance measuring equipment provided in the cable landing station and 41 represents an equivalent capacitor having capacitance C1 formed by the submarine cable between the landing station and the open fault point. The capacitance measuring equipment consists of a charging voltage supply source 42 having a measuring voltage V1, a change-over switch 43, an operational amplifier 44, an input resistor 45, a standard capacitor 46 having capacitance C2 and a DC voltmeter 47. An integrating circuit is being formed by the operational amplifier 44, the input resistor 45.

When an open-circuit fault has been found out, the electric charge remained in the cable is made discharged to the ground so as to the cable is made to charge-free state. Then, the change-over over switch 43 is turned so that the charging voltage supply unit 42 is connected with the equivalent-capacitor 41, so the capacitance C1 is charged with the charging current $I_1$ up to the measuring voltage V1. The charge Q1 stored in the equivalent-capacitor 41 is represented as $$Q1 = C1 \cdot V1.$$

Then, the change-over switch 43 is made to connect the equivalent-capacitor with the integrating circuit. Because the integrating circuit has the operational amplifier 44 which has almost infinite gain and very high input impedance, the negative input terminal of the operational amplifier can be regarded as imaginary short-circuit to the ground, therefore the equivalent capacitor 41 is regarded as connected with the ground and discharging current $I_2$ from the equivalent capacitor 41 flows through the input resistance 45. This discharging current $I_2$ flowing into the negative terminal of the operational amplifier 44, can not flow into the operational amplifier 44 because of its high input impedance, and flows into the standard capacitor 46, charging the capacitance C2. This means that the output voltage V2 of the operational amplifier 44, measured by the DC voltmeter 47, represents the voltage across capacitance C2 caused by the charge flowed into.

So after a discharge-time long enough to complete discharging the equivalent capacitor 41, the stored charge Q2 in capacitance C2 is shown as $$Q2 = \int I_2 dt = C2 \cdot V2.$$

As the amount of the charge discharged from C1 equals to the charge stored in C2, the relationship of V1 to V2 is shown as $$Q1 = Q2 = C1 \cdot V1 = C2 \cdot V2.$$

So the capacitance C1 of equivalent capacitor formed by the submarine cable can be obtained as $$C1 = C2 \cdot V2 / V1$$

wherein values of C2, V2 and V1 are already known.

Therefore, using the value Co which is given as capacitance per unit length of the submarine cable, the distance L between the measuring point and the fault point can be obtained as $$L = C1 / CO.$$

As explained above, the fault locating method by capacitance measurement includes a process of measuring the total amount of charge stored in an equivalent capacitor formed by the submarine cable, in order to obtain the cable capacitance. Therefore, it is necessary in order to achieve high accurate measurement that (1). every portion of the cable along the total length must be charged up to the equal potential to measuring voltage V1, and (2) the total charge stored in the cable must be discharged entirely into the standard capacitor.

Meanwhile, each submarine equipment inserted in the submarine cable has at least one forward diode connected in series to the feed line, in order to rectify the feed current in the bidirectional feeding system, or to prevent backward surge energy in the unidirectional feeding system.

In order to supply normally the main processing circuit with the operating current, because the voltage drop caused by the Zener diode in each of several hundreds submarine equipment is several to several tens volt, the feed current supply unit at the landing station is arranged to provide a respective high supply voltage of several thousand volt so that every Zener diode becomes conductive.

However, in case of capacitance measurement for the fault location, the measuring voltage V1 of about 100 volt is usually applied because of the simplicity of measuring equipment, which voltage is not enough to drive hundreds of Zener diodes connected in series in the charging route, so each Zener diode shows high impedance against the charging current, and the charging current flows only through the resistance RS connected in parallel with the zener diode.

Now it will be explained using FIGS. 6 and 7, that the problem caused in the capacitance measuring procedure applied to the submarine cable communication system using the submarine equipment which does not have the charging/discharging resistor RS nor the shunt capacitor CS.

Figure 6:
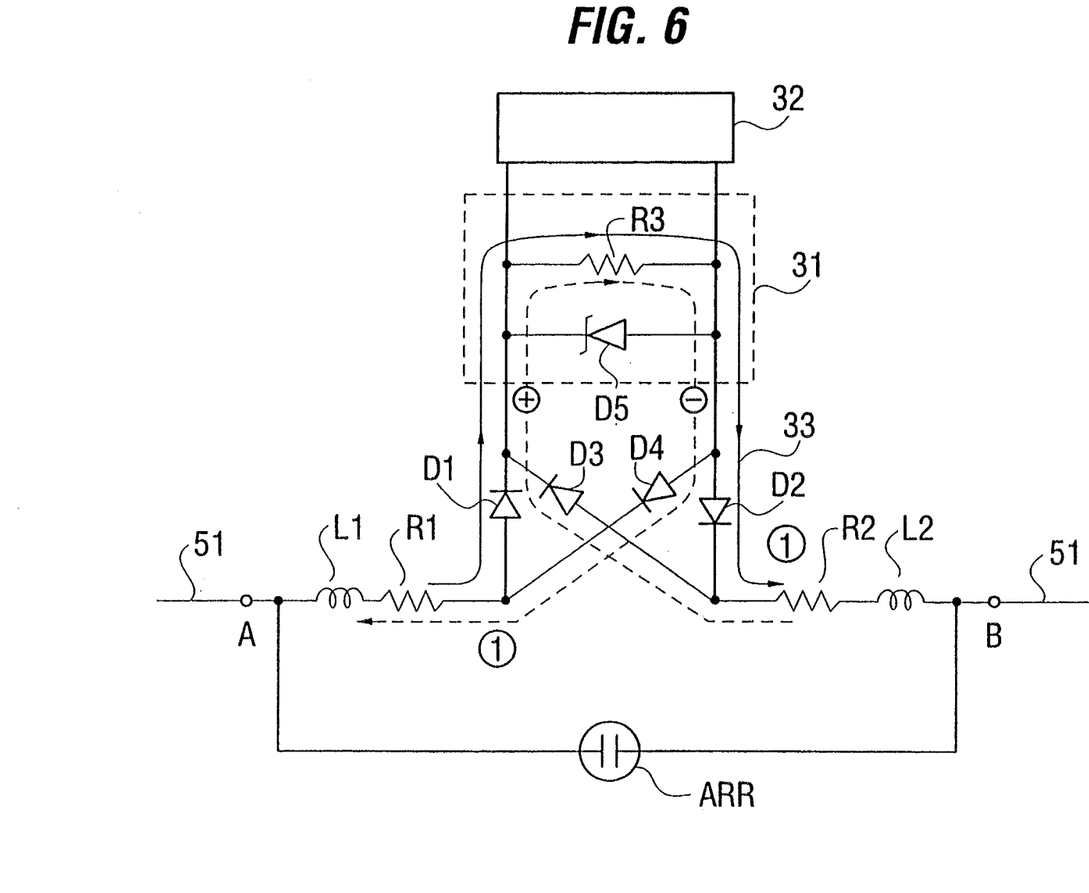
FIG. 6 is a diagram of a unidirectionally fed submarine equipment without a charging/discharging resistor, explaining the charging/discharging route in a fault locating process.

In FIG. 6, there is shown a submarine equipment for the bidirectional feeding system, having no charging-/discharging resistor nor shunt capacitor.

Figure 7:
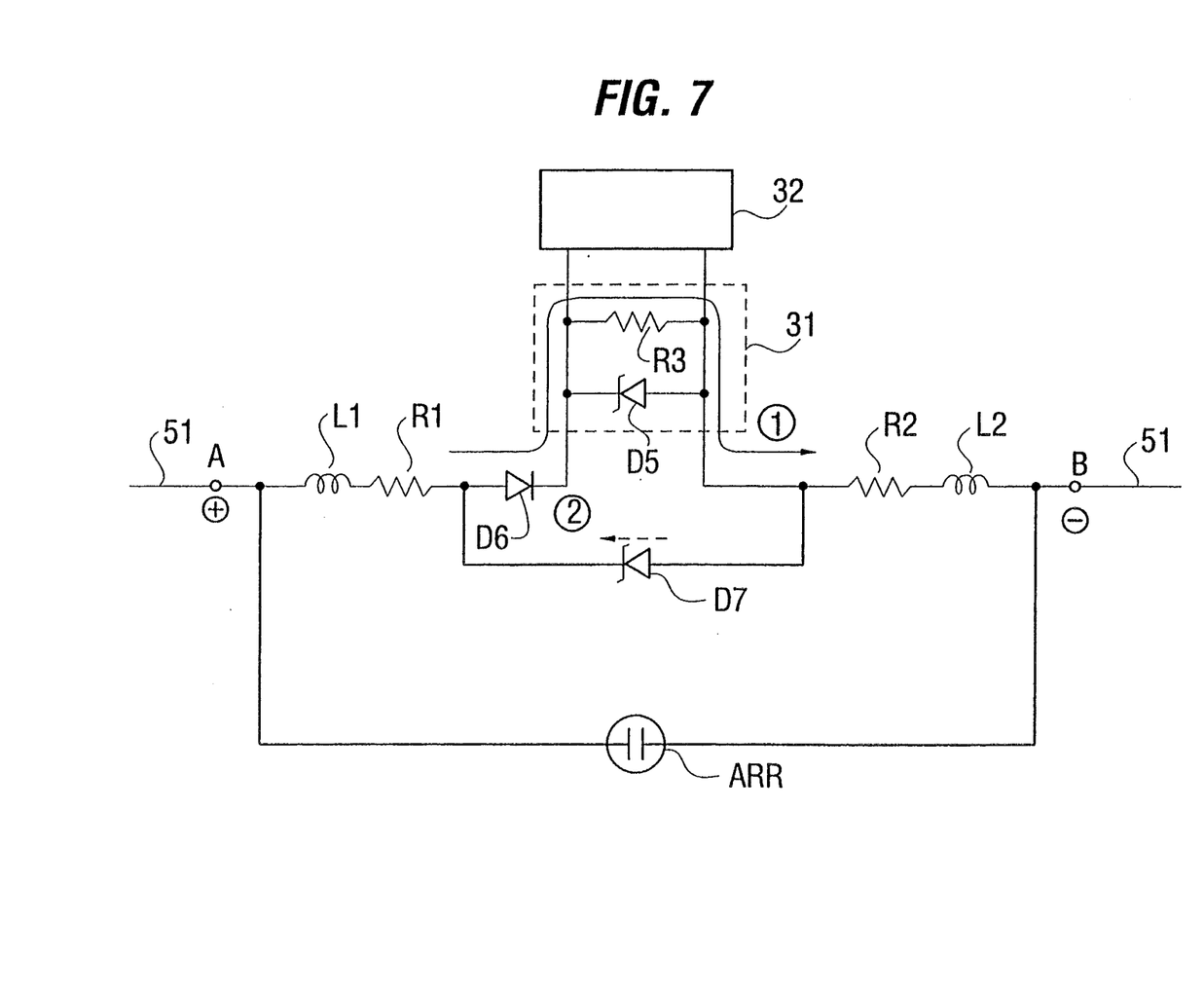
FIG. 7 is a block diagram for explaining the principle of a fault locating process using the capacitance measuring method.

In FIG. 7, there is shown a submarine equipment for the unidirectional feeding system, having no charging-/discharging resistor nor shunt capacitor.

In both figures, the solid arrow ①  shows the current flowing path by which the charging current for the cable capacitance measurement flows through the equipment. That is, the charging current flows through each equipment by the path of diode D1→ resistor R3→ diode D2 in the case of FIG. 6, and by the path of diode D6→ resistor R3 in the case of FIG. 7.

Similarly, as shown by a dotted arrow ② in both figures, the discharging current for discharging the charge stored in the cable, having the direction opposite to that of charging current, flows through the equipment by the path of diode D3→ shunt resistor R3→ diode D4 in the case of FIG. 6, and by the path of diode D7 which is made in the forward-active region by the discharging current in the case of FIG. 7.

Generally, since the voltage-current characteristics of diode is nonlinear in the forward-active region, so that the forward resistance of diode is not constant but varies with applied voltage, and increases rapidly to an extremely high value as the current approaches zero.

In the capacitance measuring procedure of the fault locating method, at the final stage of charging or discharging operation, as the potential difference across the submarine equipment approaches zero, the resistance of diode thereof approaches infinitely the value R0 which value is expressed as $V_T / I_0$, wherein, $V_T$ is the thermal voltage of the diode, and $I_0$ is the reverse saturation current of the diode.

As the value $I_0$ is extremely small in such a diode used in the high reliable submarine equipment, $R_0$ has extremely large value so that the time required to charge or discharge completely the cable capacitance, in the other words, to make all portions of the cable be at equi-potential, increases to the value not to be ignored to the measuring time of the fault locating method.

That is, as explained above, it takes long time to charge or discharge completely the cable capacitance, when the fault locating method is carried out to the submarine cable communication system in which the submarine cable has a plurality of submarine equipment inserted in feed line, each of which equipments has at least one diode forward to the direction of the current flow and does not have any charging/discharging resistor RS. And in order to obtain the cable capacitance within the limited measuring time, the accuracy of the capacitance measurement is sacrificed because the switching from the charging mode to the discharging mode should be performed before the charging mode has completed, and because the voltage measurement of C1 should be carried out during the discharging procedure.

In order to improve above mentioned disadvantages caused from diodes connected in series in the feed line, each of submarine equipments according to the present invention is provided with a charging/discharging resistor RS connected in parallel to the series diode so that the charging/discharging current is able to bypass via the charging/discharging resistor, instead of via the series diode, during the capacitance measuring procedure.

Using FIG. 5, showing the capacitance measuring procedure, it will be explained below that how the fault locating method is carried out and how the submarine equipment operates therein effectively in the event of a cable fault occurs at a certain repeating section along the submarine cable, having submarine equipments (shown in FIG. 3.and in FIG. 4) by preferred embodiments according to the present invention.

step 1: When the open-circuit fault of the feed line is found out, the feeding of operating power is stopped, then the remaining charge stored in the cable made discharged by connecting the land-side end of the feed line to the ground at the landing station.

At the earlier stage of this discharging procedure, the discharging current flows mainly via the diode connected in forward direction to the current flow because the potential difference across each submarine equipment is still large enough to forward-bias the diode therein.

That is, as shown in FIG. 3 for bidirectional feeding system, assuming the direction of normal feeding current to be from A to B, the discharging current which has the opposite direction to the feeding current, flows through the submarine equipment via the route, diode D3→ shunt resistor R3→ diode D4.

Similarly in the FIG. 4 for unidirectional feeding system, it flows via the forward-biased Zener diode D7.

As the progress of discharging, the charge of the cable at each repeating section has been lowered and the forward directional voltage of each of their diodes is lowered to approach zero because the voltage between the terminals of the submarine equipment is lowered. As a result, the discharging current passing through the diode is reduced, causing the resistance to be enlarged. The charge is mainly made to flow to the landing station via the charging/discharging resistor RS (dotted arrow ① shown in FIGS. 3 and 4) from a moment the resistance of the diode becomes larger than that of the charging/discharging resistor RS. Since the resistance value of the charging/discharging resistor RS is kept constant regardless to the voltage applied, the overall discharge can be completed in a finite time according to a predetermined time constant.

step 2: When the change-over switch 43 of the capacitance measuring equipment is turned so as to make the charging voltage supply source 42 connect to the cable, the equivalent capacitor formed by the feed line conductor and the sea water is sequentially charged with the measuring voltage of 100 V starting from the relay repeating section adjacent to the landing station. Since the potential difference between the two terminative feed lines of the submarine equipment is relatively large at this time, the charging current flows through the equipment, being properly branched to the path same as at the normal feeding state (the solid arrow ① shown in FIGS. 8 and 4) and the path (the solid arrow ② shown in FIGS. 3 and 4) which passes through the charging/discharging resistor RS. With the progress of the charging of the capacitance in each repeater section, the voltage between the terminals of each submarine equipment is lowered. When the voltage across the diode in series inserted into the feeding route in the repeater or the branching unit has become to a level below a predetermined value, the charge mainly flows via the charging/discharging resistor RS. As a result, all of the cable sections can be charged to a desired level, the error of which is included by a predetermined allowable range in a finite time.

step 3: When the change-over switch 43 of the capacitance measuring equipment is then changed over so as to make the cable connect to the operational amplifier 44, the terminative end of the feed line is equivalently grounded at the landing station. Therefore, the charge stored in the cable as described above is discharged through the aforesaid discharging path, causing the charge to be stored in the standard capacitor 46.

Since the charge is, similarly to step 1, discharged via the charging/discharging resistor RS at the time of final discharging stage, the problem that an excessively long time takes to complete the discharge due to the enlargement of resistance of the forward directional diode in series inserted into the discharge passage can be prevented. Hence, the discharge can be completed in a shorter time as compared with the conventional technology.

In a specific structural example of a system which uses an optical submarine cable having an arrangement that the electrostatic capacity established by the feed line of the cable and the sea water ground is about 0.18 $\mu$F/km and the series resistance of the feed line is about 0.7 $\Omega$/km and in which hundreds of submarine equipment, each of which accommodates three power units, are inserted at intermediate interval into the submarine cable of the length of thousands of km, disposed between the landing station and the open-circuit fault point, the time taken to complete the charging/discharging operation at a predetermined accuracy is about 10 minutes. Therefore, the time can be significantly shortened so that the fault locating method by capacitance measurement becomes practical use and useful.

When the pulse echo method is employed, the capacitor in parallel connected to the diode is made to have a sufficiently low impedance with respect to the pulse frequency so that the pulses can be transmitted on the feed line while bypassing the forward directional diode and the charging/discharging resistor RS. Therefore, the emitted pulses and the reflected pulses can be freed from damping and deflection taken place at the power unit, causing an effect to be obtained in that the fault location can be accurately performed.

As described above, according to the present invention, the location of an open-circuit fault occurred in a submarine cable provided with a plurality of submarine equipments each having forward directional diodes in series disposed in the feed line can be accurately and quickly detected by the capacitance measuring method.

Consequently, an effect can be obtained in that the performance of fault locating in a submarine cable communication system can be improved.

What is claimed is:

1. Submarine equipment for a submarine cable communication system, which is inserted in a submarine cable connecting a plurality of cable landing stations, and is supplied with operating currents from the cable landing stations through a feed line of the submarine cable, said submarine equipment comprising:

a main processing circuit for transmitting communication signals through the submarine cable;

a power unit, connected in series to the feed line, for receiving the operating current from the feed line and for supplying power to said main processing circuit;

a nonlinear resistance device which is inserted between said power unit and the feed line, whose resistance increases according to decrease in the feed current; and a charging/discharging resistor connected in parallel to said nonlinear resistance device.

2. Submarine equipment for a submarine cable communication system according to claim 1, further comprising a shunt capacitor connected in parallel to said charging/discharging resistor.

3. Submarine equipment for a submarine cable communication system, which is inserted in a submarine cable connecting a plurality of cable landing stations, and is supplied with operating currents from the cable landing stations through a feed line of the submarine cable, said submarine equipment comprising:

a main processing circuit for transmitting communication signals through the submarine cable;

a power unit for supplying operating power to said main processing circuit;

a rectifier circuit, connected in series to the feed line, for providing one-way current to said power unit by taking out the operating current from the feed line, regardless of a direction in which the operating current from the cable landing stations is fed; and a charging/discharging resistor connected in parallel to said rectifier circuit at the input thereof.

4. Submarine equipment according to claim 3, wherein said rectifier circuit is a diode bridge rectifier circuit.

5. Submarine equipment for a submarine cable communication system, which is inserted in a submarine cable connecting a plurality of cable landing stations, and is supplied with operating currents from the cable landing stations through a feed line of the submarine cable, said submarine equipment comprising:

a main processing circuit for transmitting communication signals through the submarine cable;

a power unit, connected in series to the feed line, for receiving the operating current from the feed line and for supplying power to said main processing circuit;

a first nonlinear device, connected in series to said power unit, for preventing a surge current from flowing in a direction opposite to said direction of operating currents;

a second nonlinear device, connected in parallel to a circuit composed of said first nonlinear device and said power unit connected in series, for bypassing the surge current therethrough; and a charging/discharging resistor connected in parallel to said second nonlinear device.

6. Submarine equipment according to claim 5, wherein said first nonlinear device is a diode inserted in a forward direction with respect to said direction of operating currents, and said second nonlinear device is a Zener diode.

7. A fault locating method for a submarine cable communication system, in which a plurality of cable landing stations are connected to each other by submarine cables with a plurality of submarine equipment inserted in the cable and the submarine equipment is fed with electric power from said landing station via a feed line included in the submarine cable carrying communication signals, said fault locating method comprising the steps of:

charging an equivalent-capacitor formed between the feed line extending from the landing station to the fault point and sea-water ground, through a charging route consisting of the feed line and charging-/discharging resistors each connected in parallel to a nonlinear resistance device of the submarine equipment until the equivalent-capacitor is charged up to a predetermined voltage;

discharging the charge reversely from the equivalent-capacitor to the landing station through the charging route;

measuring the capacitance of the equivalent-capacitor; and locating the fault point of the cable based on the capacitance measured, by using the known capacitance measuring method.

* * * * *